(12) United States Patent
Bambridge et al.

(10) Patent No.: US 7,086,148 B2
(45) Date of Patent: Aug. 8, 2006

(54) METHODS AND APPARATUS FOR WIRE BONDING WITH WIRE LENGTH ADJUSTMENT IN AN INTEGRATED CIRCUIT

(75) Inventors: Timothy Brooks Bambridge, Pittstown, NJ (US); John Wayne Bowen, Warminster, PA (US); John McKenna Brennan, Wyomissing, PA (US); Joseph Michael Freund, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 71 days.

(21) Appl. No.: 10/787,010

(22) Filed: Feb. 25, 2004

(65) Prior Publication Data

US 2005/0183265 A1 Aug. 25, 2005

(51) Int. Cl.
*H05K 3/00* (2006.01)

(52) U.S. Cl. .................. 29/843; 29/842; 29/850; 228/4.5; 228/179; 228/180.5

(58) Field of Classification Search ............ 29/854, 29/857, 867, 842, 843, 850; 228/4.5, 179, 228/180.5
See application file for complete search history.

(56) References Cited

U.S. PATENT DOCUMENTS

| | | | | |
|---|---|---|---|---|
| 4,327,860 A | * | 5/1982 | Kirshenboin et al. | 228/180.5 |
| 4,445,633 A | * | 5/1984 | Bonham, Jr. | 228/102 |
| 4,932,584 A | * | 6/1990 | Yamazaki et al. | 228/180.5 |
| 5,111,989 A | * | 5/1992 | Holdgrafer et al. | 228/110.1 |
| 5,156,323 A | * | 10/1992 | Kumazawa et al. | 228/180.5 |
| 5,176,310 A | * | 1/1993 | Akiyama et al. | 228/180.5 |
| 6,010,057 A | * | 1/2000 | Egger et al. | 228/102 |
| 6,119,926 A | * | 9/2000 | Egger et al. | 228/180.5 |
| 6,467,678 B1 | * | 10/2002 | Mochida et al. | 228/180.5 |
| 6,640,436 B1 | * | 11/2003 | Kimura et al. | 29/867 |
| 6,854,637 B1 | * | 2/2005 | Harun et al. | 228/180.5 |
| 6,933,223 B1 | * | 8/2005 | Soon et al. | 438/617 |

OTHER PUBLICATIONS

V. Solberg, "Adapting Fine-Line Flex Circuits for 3D Multiple Die Packaging," Semiconductor Manufacturing, pp. 94-108, Jun. 2003.

* cited by examiner

*Primary Examiner*—Carl J. Arbes

(57) ABSTRACT

An integrated circuit is wire bonded in a manner such that there is consistent RF performance from integrated circuit package to integrated circuit package. Bond distances within the integrated circuit are measured, each corresponding to a wire bond to be formed. An area under a hypothetical wire bond profile is calculated as a function of the bond distances, a baseline wire length, and a baseline loop height. A wire is bonded across a given one of the bond distances to form a given one of the wire bonds. A wire bond profile for the given wire bond is provided having an area thereunder that is substantially equal to the calculated area.

17 Claims, 4 Drawing Sheets

METHODS AND APPARATUS FOR WIRE BONDING WITH WIRE LENGTH ADJUSTMENT IN AN INTEGRATED CIRCUIT

CROSS REFERENCE TO RELATED APPLICATIONS

This application is related to the U.S. patent application Attorney Docket No. Miller 2-1, entitled "Methods and Apparatus for Integrated Circuit Ball Bonding With Substantially Perpendicular Wire Bond Profiles," which is filed concurrently herewith and incorporated by reference herein.

FIELD OF THE INVENTION

The present invention relates generally to the field of integrated circuits and, more particularly, to wire-bonding operations performed on an integrated circuit during packaging.

BACKGROUND OF THE INVENTION

A radio frequency (RF) integrated circuit may include multiple transistor dies. A die attach machine is used to place the transistor dies in an integrated circuit package. The die attach machine attempts to place each die in its appropriate position within the package. However, every die attach machine has a specified tolerance allowing some variance in the placement of the dies. Thus, the actual position of a given die within the package may differ from its ideal position by an amount less than or substantially equal to the tolerance. A robotic bonding tool may then be used to wire-bond the dies to other circuit elements within the package, and to leads of a package leadframe. Such a tool generally includes a surface/wire-feed detection system that detects bond pads or other bonding sites of a given die, and determines the height coordinates of these bond pads. The other circuit elements in an RF integrated circuit may include, for example, tuning capacitors.

A wire bond profile may be characterized as a side or profile view of a wire extending from a first bond site to a second bond site. In an RF integrated circuit, the wire bonds may carry high frequency signals. Certain types of RF integrated circuits, such as RF power transistors, are tuned through these wire bond profiles.

Since the placement of a transistor die within the package can vary from one attach series to the next due to the die attach machine tolerance, an associated variation in the RF performance of the circuit may result. The variation in RF performance may be caused by unequal areas under wire bond profiles connecting similar elements of the integrated circuit. In conventional practice, the wire bond length is generally held constant regardless of the bond distance between a given pair of first and second bond sites. Therefore, as the bond distance changes, the area under the wire bond profile changes, causing inconsistent RF performance from package to package.

Attempts to compensate for the tolerance of the die attach machine include increasing the size of the bond pads so that while wire length remains constant and the distance varies between bond sites, the wire may still be bonded on the bond pad without greatly affecting the loop height and the resulting area under the wire bond profile. Bond operations may be performed on a portion of the bond pad closer to the perimeter of the die or on a portion of the bond pad closer to the interior of the die. However, many die attach machine tolerances are too great to be fully compensated for by the size of the bond pad. Further, larger bond pads take up valuable room on the surface of the die that may be used for circuitry. Finally, die attach machines with very low tolerances greatly increase the cost of packaging.

Traditional bonding tools have also been equipped with mechanical features called "close at loop" and "close at bond." Close at bond is the standard clamp close position in which the clamps will close after the second bond contact. Close at loop will close the wire clamps at the peak position of the looping trajectory, reducing the variation from wire to wire. However, such features are purely mechanical and associated with a wire clamp mechanism. Since no actual calculation of the area under the wire profile is made using the bond distance, the process is not very accurate or repeatable.

Thus, a need exits for improved wire-bonding techniques, particularly in RF integrated circuit applications.

SUMMARY OF THE INVENTION

The present invention in an illustrative embodiment provides techniques for calculating and adjusting the area under a wire bond profile during the wire-bonding process, thereby allowing for consistent wire bond impedance and RF performance from package to package for a given type of integrated circuit.

In accordance with one aspect of the invention, a method is provided for performing a wire-bonding operation in an integrated circuit. Bond distances within the integrated circuit are measured, each corresponding to a wire bond to be formed. An area under a hypothetical wire bond profile is calculated as a function of the bond distances, a baseline wire length, and a baseline loop height. A wire is bonded across a given one of the bond distances to form a given one of the wire bonds. A wire bond profile for the given wire bond is provided having an area thereunder that is substantially equal to the calculated area.

Advantageously, providing substantially equal areas under wire bond profiles results in improved consistency in RF performance from package to package for a given type of integrated circuit. Tolerances for the die attach process also may be relaxed, thereby allowing for the use of a less expensive die attach machine. Other advantages include the potential for decreased manufacturing cycle time, and an ability to reduce bonding pad size. In addition, a software algorithm implementation of the present invention may be configured by modification of otherwise conventional bonding tool software, through a cost-effective software upgrade. The results of the algorithm may be easily verified and tracked using process control.

These and other objects, features, and advantages of the present invention will become apparent from the following detailed description of the illustrative embodiments thereof, which is to be read in connection with the accompanying drawings.

DETAILED DESCRIPTION OF THE PREFERRED EMBODIMENTS

As will be illustrated in detail below, the present invention in the illustrative embodiment provides techniques for calculating and adjusting the area under a wire-bond profile during a wire-bonding process so that there is consistent RF performance from package to package for a given type of integrated circuit.

Figure 1:
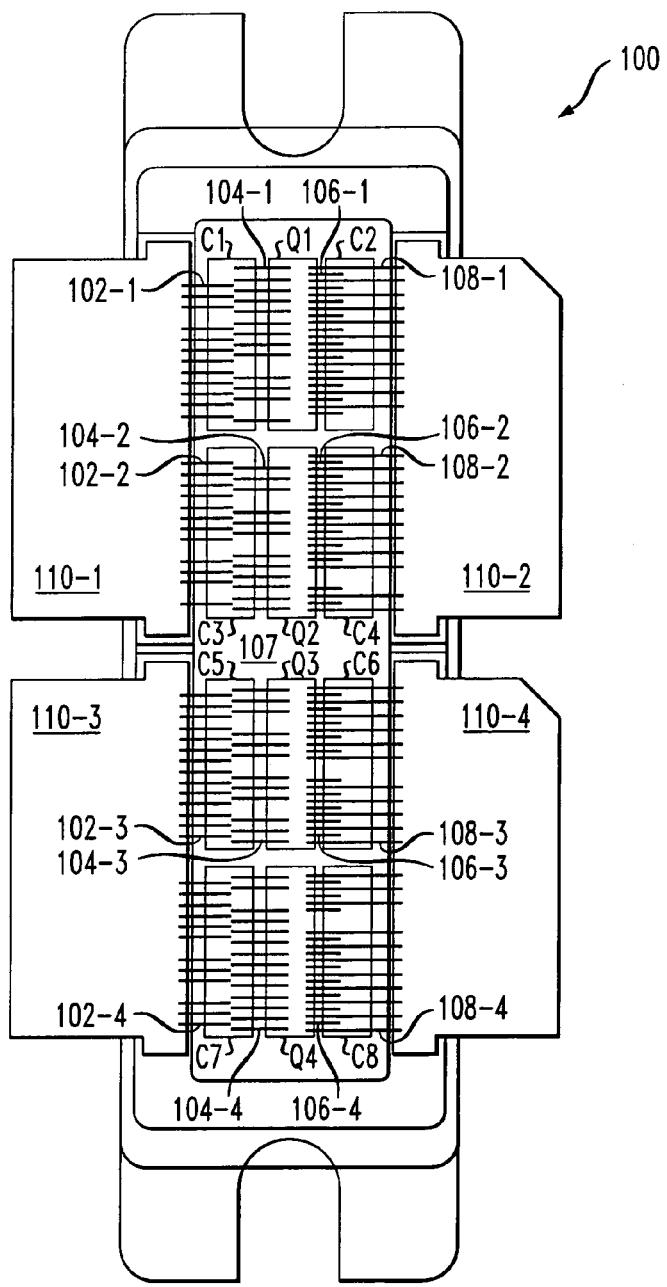
FIG. 1 is a diagram illustrating a top cut-away view of a packaged integrated circuit having wire bonds between dies, capacitors and package leads, according to an embodiment of the present invention.

Referring initially to FIG. 1, dies Q1, Q2, Q3, Q4, are disposed in a packaged RF integrated circuit 100 on a substrate 107. Integrated circuit 100 is shown with an upper portion of the package removed so that the internal elements and wires are visible. FIG. 1 shows die Q1 disposed between capacitors C1, C2; die Q2 between capacitors C3, C4; die Q3 between capacitors C5, C6; and die Q4 between capacitors C7, C8. In this embodiment, dies Q1–Q4 are transistor dies and capacitors C1–C8 are tuning capacitors of packaged RF integrated circuit 100. Dies Q1–Q4 and tuning capacitors C1–C8 are disposed within an integrated circuit package. The package comprises a leadframe having leads illustrated by elements 110-1, 110-2, 110-3, 110-4.

A die attach machine places dies Q1–Q4 between tuning capacitors C1–C8 as described above. The die attach machine attempts to place each die in a similar position relative to its respective adjacent tuning capacitors and integrated circuit package leads. If each die is placed in a similar position, the bond distances, or distances between dies and tuning capacitors, and dies and package leads, would remain constant throughout the integrated circuit. However, due to die attach machine tolerances, the bond distances will vary from die to die, package to package, and even wire bond to wire bond if one or more of the dies are skewed.

As shown in the figure, first set of wires 102-1 connects lead 110-1 to first tuning capacitor C1. Similarly, a second set of wires 104-1 connects first tuning capacitor C1 to die Q1, a third set of wires 106-1 connects die Q1 to second tuning capacitor C2, and a fourth set of wires 108-1 connects die Q1 to lead 110-2. These wire sets are repeated for each capacitor-die-capacitor arrangement. Wire sets 102-2, 104-2, 106-2, 108-2 provide connections for die Q2 and its associated capacitors C3 and C4. Wire sets 102-3, 104-3, 106-3, 108-3 provide connections for die Q3 and its associated capacitors C5 and C6. Wire sets 102-4, 104-4, 106-4, 108-4 provide connections for die Q4 and its associated capacitors C7 and C8.

Figure 2:
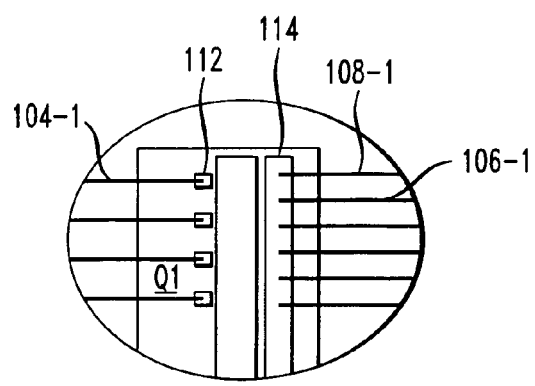
FIG. 2 is a diagram illustrating a magnified view of a die of the integrated circuit of FIG. 1, according to an embodiment of the present invention.

Referring now to FIG. 2, a more detailed view of a portion of die Q1 is shown, illustrating the set of wires 104-1 extending out from the left side of die Q1, and sets of wires 106-1 and 108-1 extending out from the right side of die Q1. In this embodiment, sets of wires 104-1 and 106-1 connect to tuning capacitors, while set of wires 108-1 connects to the integrated circuit package lead 110-2. Wires of the set 104-1 are individually bonded to die Q1 at individual bond pads 112. Sets of wires 106-1 and 108-1 are bonded to die Q1 at a bond strip 114. Bond pads, bond strips or other types of bonding sites can be utilized for each of the bonding areas on the dies, capacitors or leads.

Figure 3:
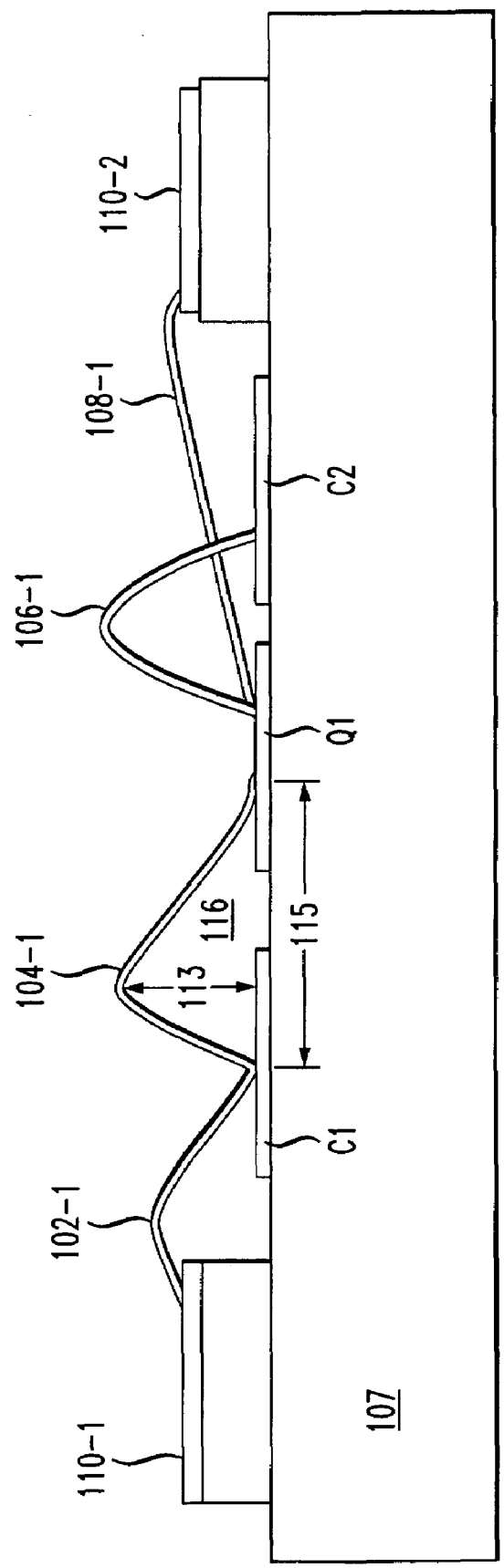
FIG. 3 is a diagram illustrating wire bond profiles of the integrated circuit of FIG. 1, according to an embodiment of the present invention.

FIG. 3 illustrates example wire bond profiles of the embodiment of the present invention shown in FIGS. 1 and 2. A first wire, from wire set 102-1, connects lead 110-1 to tuning capacitor C1. A second wire, from wire set 104-1, connects tuning capacitor C1 to die Q1. A third wire, from wire set 106-1, connects die Q1 to tuning capacitor C2. A fourth wire, from wire set 108-1, connects die Q1 to lead 110-2. An example of wire bond loop height 113 is shown relating to the wire from wire set 104-1. The wire bond loop height 113 is the magnitude of deviation, or maximum perpendicular distance, of a wire from the first bond site. Thus, each wire has an associated bond loop height.

An example of bond distance 115 is also shown relating to the wire from wire set 104-1. Bond distance is generally defined herein as the straight line distance between first and second bond sites associated with a given wire bond. This distance may change depending upon factors such as die placement variation. Thus, each wire has an associated bond distance. Further, an example of an area 116 under a wire bond profile is also shown in relation to the wire from wire set 104-1. This area is bounded by the wire, substrate 107, and portions of the dies and/or capacitors disposed beneath the wire.

The following chart illustrates sample bond distance measurements and wire bond loop heights for wires in wire sets 102-1, 104-1, 106-1 and 108-1, as determined for an exemplary implementation of this embodiment. All distance measurements and loop heights are in mils.

| | 102-1 | | 104-1 | | 106-1 | | 108-1 | |
|---|---|---|---|---|---|---|---|---|
| Wire | Distance | Height | Distance | Height | Distance | Height | Distance | Height |
| 1 | 79.15 | 28.58 | 59.95 | 43.96 | 56.35 | 42.90 | 115.55 | 27.98 |
| 2 | 79.10 | 28.56 | 59.75 | 44.26 | 56.45 | 42.78 | 115.40 | 28.18 |
| 3 | 78.90 | 28.22 | 60.05 | 44.24 | 56.35 | 43.12 | 115.50 | 28.24 |
| 4 | 78.90 | 28.18 | 59.90 | 44.38 | 56.35 | 42.96 | 115.45 | 28.18 |
| 5 | 79.10 | 27.54 | 59.80 | 44.16 | 56.30 | 42.84 | 115.50 | 28.30 |
| 6 | 79.20 | 27.86 | 59.70 | 44.08 | 56.45 | 42.66 | 115.35 | 28.50 |
| 7 | 78.65 | 27.90 | 60.35 | 44.28 | 56.35 | 43.24 | 115.35 | 28.60 |
| 8 | 78.50 | 27.80 | 60.20 | 44.32 | 56.45 | 42.84 | 115.50 | 28.32 |
| 9 | 78.95 | 28.44 | 59.95 | 44.28 | 56.35 | 43.02 | 115.45 | 29.06 |
| 10 | 79.05 | 28.42 | 59.85 | 44.12 | 56.35 | 42.92 | 115.45 | 28.72 |
| 11 | 79.40 | 28.30 | 59.45 | 44.08 | 56.40 | 43.12 | 115.50 | 28.86 |

-continued

| | 102-1 | | 104-1 | | 106-1 | | 108-1 | |
|---|---|---|---|---|---|---|---|---|
| Wire | Distance | Height | Distance | Height | Distance | Height | Distance | Height |
| 12 | 79.50 | 27.98 | 59.35 | 43.82 | 56.50 | 42.82 | 115.35 | 28.54 |
| 13 | 79.00 | 28.76 | 59.80 | 44.20 | 56.30 | 43.26 | 115.50 | 28.64 |
| 14 | 79.05 | 28.74 | 59.75 | 44.36 | 56.40 | 42.90 | 115.45 | 28.56 |
| 15 | 78.80 | 28.48 | 59.80 | 44.36 | 56.40 | 42.72 | 115.45 | 28.48 |
| 16 | 78.90 | 28.56 | 60.00 | 44.16 | 56.40 | 42.70 | 115.40 | 28.64 |
| 17 | 79.45 | 27.92 | 59.40 | 44.24 | 56.35 | 43.10 | 115.50 | 28.48 |
| 18 | 79.55 | 27.80 | 59.35 | 44.00 | 56.45 | 42.76 | 115.40 | 28.22 |
| 19 | 79.00 | 27.74 | 59.80 | 44.18 | 56.25 | 43.22 | 115.35 | 28.30 |
| 20 | 79.35 | 27.82 | 59.50 | 44.40 | 56.45 | 42.78 | 115.45 | 28.54 |
| Min | 78.50 | 27.54 | 59.35 | 43.82 | 56.25 | 42.66 | 115.35 | 27.98 |
| Max | 79.55 | 28.76 | 60.35 | 44.40 | 56.50 | 43.26 | 115.55 | 29.06 |
| Ave | 79.08 | 28.18 | 59.79 | 44.19 | 56.38 | 42.93 | 115.44 | 28.47 |

It is to be appreciated that these sample distance measurements and loop heights are presented by way of illustrative example only, and should not be construed as limiting the scope of the invention in any way.

Figure 4:
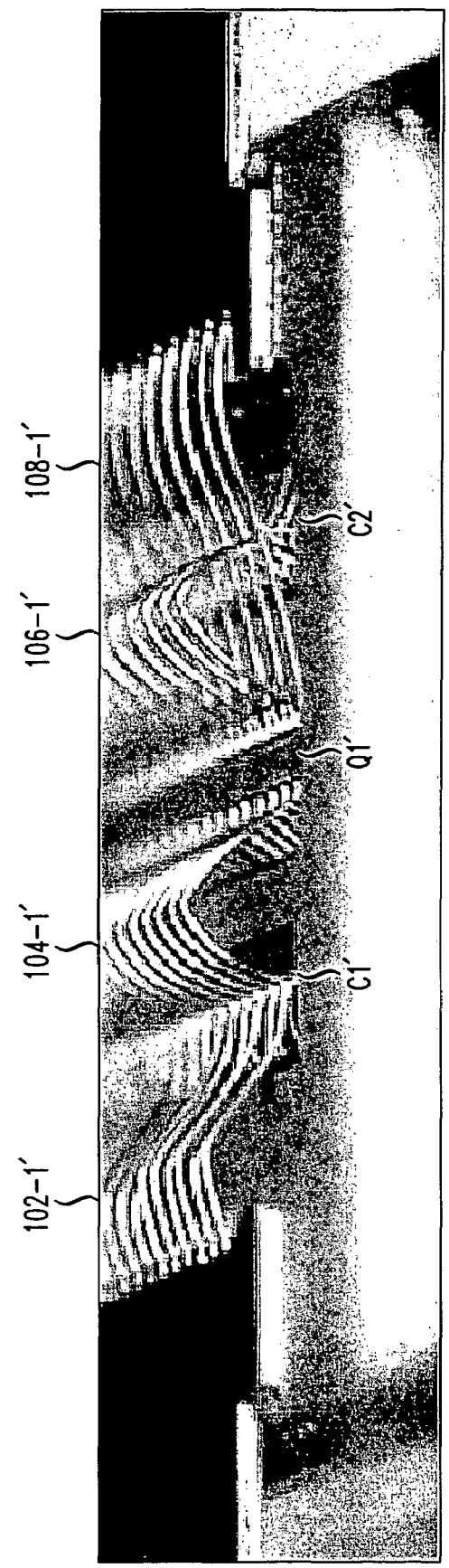
FIG. 4 is a wire bond profile perspective view of an integrated circuit, according to an embodiment of the present invention.

FIG. 4 shows a wire bond profile perspective view of an integrated circuit configured in the manner described in conjunction with FIGS. 1, 2 and 3. The figure illustrates that the wire bonds connecting similar integrated circuit elements have substantially equal areas beneath their wire bond profiles for consistent RF performance. For example, all wire bond profile areas beneath of second set of wires 104-1', joining first tuning capacitor C1' and die Q1', are substantially equal. Similarly, all wire bond profile areas beneath third set of wires 106-1', joining die Q1' and second tuning capacitor C2', are also substantially equal, as are the areas under first set of wires 102-1' and fourth set of wires 108-1'. Through the techniques of the present invention, the area under each wire bond profile remains substantially the same for similar connections throughout the bonding process.

Figure 5:
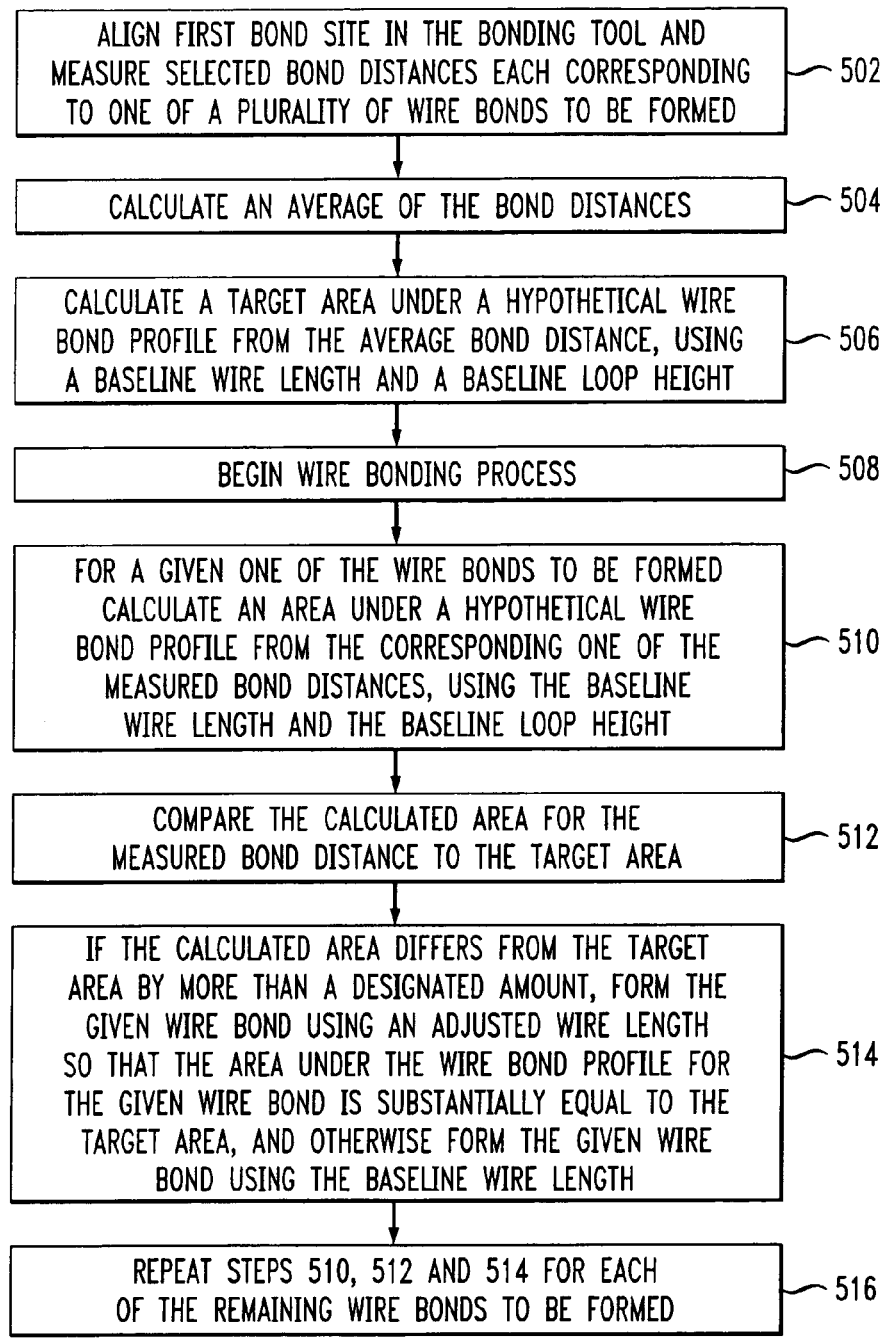
FIG. 5 is a flow diagram illustrating a wire-bonding technique having wire length adjustments, according to an embodiment of the present invention.

Referring now to FIG. 5, a flow diagram illustrates a wire-bonding technique utilizable to form the wire bond sets illustrated in FIGS. 1 to 4. In step 502, the first bond site is aligned in the bonding tool and selected bond distances are measured. Each bond distance corresponds to a wire bond to be formed. The bond distance in the illustrative embodiment may be viewed, for example, as the straight line distance between a first bond site and second bond site, although other types of bond distances may be used. These bonds sites may be disposed, for example, on dies, capacitors, or on leads of the integrated circuit package. This technique may be implemented in the form of a software algorithm compatible with otherwise conventional bonding tool software. For example, upon the loading of a program by an operator, such bonding tool software may align a first package and stops the bonding tool at the first bond site in that package. The operator may be given an option to measure a particular number of bond distances, such as up to 50 bond distances.

In step 504, an average bond distance is calculated from the bond distances measured in step 502. In step 506, an area under a hypothetical wire bond profile is calculated from the average bond distance, using a wire length and loop height, both of which may have been previously programmed into the bonding tool, selected by the operator, or otherwise determined. This wire length is an example of what is more generally referred to herein as a "baseline" wire length. This loop height is an example of what is more generally referred to herein as a "baseline" loop height. The area may be calculated using an integration technique, or other suitable area calculation technique, as will be readily appreciated by those skilled in the art. The calculated area under the wire bond profile for the average bond distance is also referred to herein as the "target area." In computing the target area, functions of the bond distances other than averages may also be used.

In step 508, the wire-bonding process begins. In step 510, one of the measured bond distances, the baseline wire length and the baseline loop height are used to calculate an area under a hypothetical wire bond profile for a given one of the wire bonds to be formed. In step 512, this area is compared to the target area. In step 514 the wire length, and thus the loop height, of the wire bond is adjusted during the wire-bonding process, so that the area under the wire bond profile for the given wire bond is substantially equal to the target area. This adjustment may take place if the calculated area differs from the target area by more than a designated amount. Otherwise the given wire bond is formed using the baseline wire length. In step 516, steps 510, 512, and 514 are repeated for each of the remaining wire bonds to be formed. As noted above, each of these wire bonds correspond to one of the bond distances measured in step 502.

In the adjustment step 514, loop height may be modified by a loop coefficient to accommodate varying wire lengths. The loop coefficient may be, for example, a percentage applied to the length of the wire, as follows:

(Loop Coefficient(%)/100)*Wire Length

The resulting number in mils may be added directly to the baseline loop height value. Therefore, as the wire length gets longer the loop height motion will increase to pay out more wire and stabilize heights over the various lengths.

An implementation of the present invention as a software algorithm may also provide specific screen choices, based on the otherwise conventional bonding tool software that the algorithm is incorporated into. Many different integration techniques may be utilized in the measurement of the area under the wire bond profiles. Also, measurements for the determination of an average distance between bond sites may be taken before the bonding process begins for a series of packages. This would result in wire bond profile areas that are substantially constant through each of the packages made. However, measurements may also be taken before the bonding process begins for each package. This may be desirable if, for example, the only concern is the skew of the die within the package and it is not necessary to have constant wire bond profile area from package to package.

Figure 6:
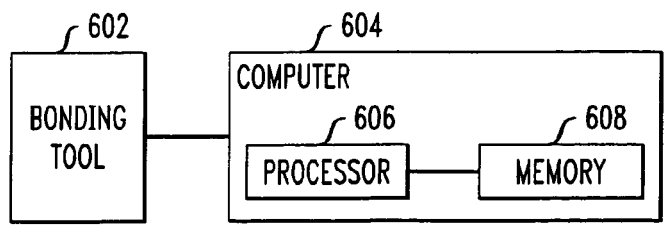
FIG. 6 is a block diagram illustrating an example bonding system suitable for implementing a wire-bonding technique according to an embodiment of the present invention.

Referring now to FIG. 6, a block diagram illustrates an example of bonding system 600 in which a wire-bonding technique of the invention may be implemented. As illustrated, the system 600 comprises a bonding tool 602 coupled to a computer 604 which may comprise a processor 606 and a memory 608. The bond distance and wire bond profile area computations of the invention may be performed at least in part utilizing software executed by processor 606 and stored in memory 608. Results of these computations are used in the bonding operations of bonding tool 602.

Accordingly, as described herein, the present invention in the illustrative embodiment provides a wire-bonding technique that creates substantially equal areas under wire bond profiles for similar connections, thereby providing consistent RF performance.

The techniques are cost-effective, and the results are easily verified and tracked using process control. Also, tolerances for the die attach process may be relaxed, thereby permitting use of a less expensive die attach machine and decreasing manufacturing cycle time.

Additional embodiments of the present invention may incorporate various numbers and combinations of transistor dies, tuning capacitors, package leads, or other circuit elements, arranged in various configurations within a given integrated circuit. The positioning and number of transistor dies, tuning capacitors and other elements will of course result in various numbers and configurations of wire bonds and associated bonding sites. The techniques of the present invention may also be used in non-RF integrated circuits.

Therefore, although illustrative embodiments of the present invention have been described herein with reference to the accompanying drawings, it is to be understood that the invention is not limited to those precise embodiments, and that various other changes and modification may be made by one skilled in the art without departing from the scope or spirit of the invention.

What is claimed is:

1. A method for performing a wire-bonding operation in an integrated circuit, comprising the steps of:
    measuring a plurality of bond distances within the integrated circuit, each corresponding to one of a plurality of wire bonds to be formed;
    calculating an area under a hypothetical wire bond profile as a function of the plurality of bond distances, a baseline wire length, and a baseline loop height; and
    bonding a wire across a given one of the bond distances to form a given one of the wire bonds;
    the bonding step being configured to provide a wire bond profile for the given wire bond having an area thereunder that is substantially equal to the calculated area.

2. The method of claim 1, wherein the calculating step calculates the area under the hypothetical wire bond profile using an average of the plurality of bond distances.

3. The method of claim 1, wherein the area under the wire bond profile for the given wire bond is adjusted by adjusting a loop height of the given wire bond relative to the baseline loop height.

4. The method of claim 1, wherein the area under the wire bond profile for the given wire bond is adjusted by adjusting a wire length of the given wire bond relative to the baseline wire length.

5. The method of claim 1, wherein the calculating step comprises the step of calculating the area under the hypothetical wire bond profile using an integration technique.

6. The method of claim 1, wherein the bonding step comprises the step of calculating an area under a hypothetical wire bond profile for the given wire bond using the given bond distance, the baseline bond wire length, and the baseline loop height.

7. The method of claim 6, wherein the bonding step comprises comparing the area under the hypothetical wire bond profile for the given wire bond to the area calculated as a function of the plurality of bond distances.

8. The method of claim 1, wherein the area under the wire bond profile for the given wire bond is adjusted in conjunction with the bonding step if that area differs from the calculated area by more than a designated amount.

9. The method of claim 1, wherein the bonding step is repeated for each of the plurality of wire bonds to be formed.

10. The method of claim 1, wherein the bonding step comprises the step of bonding the wire between a die of the integrated circuit and a capacitor of the integrated circuit.

11. The method of claim 1, wherein the bonding step comprises the step of bonding the wire between a capacitor of the integrated circuit and a lead of a package of the integrated circuit.

12. The method of claim 1, wherein the bonding step comprises the step of bonding the wire between a die of the integrated circuit and a lead of a package of the integrated circuit.

13. The method of claim 1, wherein the bonding step comprises the step of bonding the wire to a bond pad.

14. The method of claim 1, wherein the bonding step comprises the step of bonding the wire to a bond strip.

15. The method of claim 1, wherein the integrated circuit comprises a radio frequency (RF) integrated circuit.

16. The method of claim 1, wherein the integrated circuit comprises a plurality of dies.

17. The method of claim 16, wherein the integrated circuit comprises a plurality of capacitors, one or more of the dies being disposed between a corresponding pair of the capacitors.

* * * * *